United States Patent [19]

Steketee et al.

[11] Patent Number: 5,019,948
[45] Date of Patent: May 28, 1991

[54] T-RAIL PRINTED CIRCUIT BOARD GUIDE AND SUPPORT

[75] Inventors: Edward Steketee; Brad E. Clements, both of Fort Collins, Colo.

[73] Assignee: Hewlett-Packard Company, Palo Alto, Calif.

[21] Appl. No.: 434,203

[22] Filed: Nov. 10, 1989

[51] Int. Cl.⁵ .............................................. H05K 7/14
[52] U.S. Cl. ..................................... 361/415; 211/41; 361/391; 361/417; 361/420
[58] Field of Search ................. 211/41; 361/390, 391, 361/412, 415, 417, 419–420, 424, 427

[56] References Cited

U.S. PATENT DOCUMENTS

| | | | |
|---|---|---|---|
| 3,368,115 | 2/1968 | Hoffman | 361/413 |
| 3,489,954 | 1/1970 | Humphrey | 361/415 |
| 3,656,058 | 4/1972 | Leathers | 361/390 |
| 4,048,669 | 9/1977 | Bowler et al. | 361/391 |
| 4,486,816 | 12/1984 | Hope | 361/399 |
| 4,702,535 | 10/1987 | Beum | 361/415 |
| 4,739,452 | 4/1988 | Fukunaga | 361/399 |

*Primary Examiner*—Gregory D. Thompson
*Attorney, Agent, or Firm*—Guy J. Kelley

[57] ABSTRACT

A printed circuit board guide and support is disclosed which provides for mounting printed circuit boards into a housing while eliminating the need for screws or a complex housing design.

16 Claims, 4 Drawing Sheets

T-RAIL PRINTED CIRCUIT BOARD GUIDE AND SUPPORT

BACKGROUND OF THE INVENTION

1. Field of the invention

The present invention pertains generally to mounting a printed circuit board onto a surface.

2. Description of the Background

Electric and electronic apparatus using printed circuit boards for mounting electrical components have generally required mounting the boards into cases to prevent mechanical damage and to provide electromagnetic isolation in the form of a Faraday shield. The board must be securely mounted into the case and also have a stand-off to avoid any contact between the components mounted on the board and the case. In order to meet these requirements in the past has required complicated assembly parts, expensive cases, and laborious assembly procedures.

Prior techniques have included using card cage type assemblies. Card cage assemblies typically require mounting slide guides onto the housing. The assembler must work inside the housing using tools and fasteners, for example screws and screwdrivers. An alternative is a housing design which is in an open position during assembly. This requires a more complicated housing design. That type of design complicates the assembly process and the manufacturability design and consequently, the cost of the housing.

Other techniques have included fastening the board directly to the housing. This technique involves the same assembly constraints as the card cage assemblies. Assemblers must either work in a confined space in the housing using tools and fasteners or a relatively complicated housing must be designed and built which allows assembly in an open position and closes after assembly.

Still another technique has been to fasten a printed circuit board onto a rail using screws. One prior technique was a slide member having a support portion and a rail portion connected thereto. The support portion has a threaded cavity for holding a screw, the screw being aligned through a hole in a printed circuit board and the threaded cavity of the support portion so that the printed circuit board is attached to the slide member. The rail portion has a slide surface and an engaging surface, the rail portion having a length. A claw attached to the housing received the slide member and guided the slide member, in order to make contact to the engaging surface of the rail portion, and to secure the slide member to the housing in all directions except along the rail portion length. The rail, in turn, was fastened to the housing by a claw stamped and bent from the housing. The claw allowed the rail to slide along the length of the rail and the length of the housing surface while retaining the rail from moving along the other two axis, side-to-side and up-and-down. This has limitations in that generally at least four, and usually six, screws are required and must be manually attached. At least two rails are needed. Since there are multiple rails, the rails need to be carefully aligned so that the rails are parallel to each other and spaced correctly in order to fit into the claws in the housing.

The problem is to provide a board mounting into a housing design which essentially eliminates the need for assemblers to work in a limited space using tools and fasteners, reduce the number of parts required for mounting a board into a housing, and keep the housing design simple so as to make it easy to fabricate, and reduce its cost.

SUMMARY OF THE INVENTION

The present invention overcomes the limitations of the prior art by providing a slidable mounting arrangement for mounting an electric component board into a housing comprising a housing; a slide member having a rail connected to a support, the support arranged and constructed to attach to a printed circuit board, the rail having a slide surface and an engaging surface, the rail, also, having a length direction; a bent finger guide connected to the housing and making contact to the engaging surface of the rail portion of the slide member to secure the slide member to the housing in all directions except in the length direction of the rail. It is an objective of the invention to minimize the use of screws since the invention provides for designs where the gripping means or fingers can be incorporated into a one piece housing, the circuit board can be attached to the slide member outside of the housing through the use of a screwless assembly technique and then the assembly slid into the housing and the end attached to prevent the assembly from sliding along the length of the housing.

DETAILED DESCRIPTION

Figure 1:
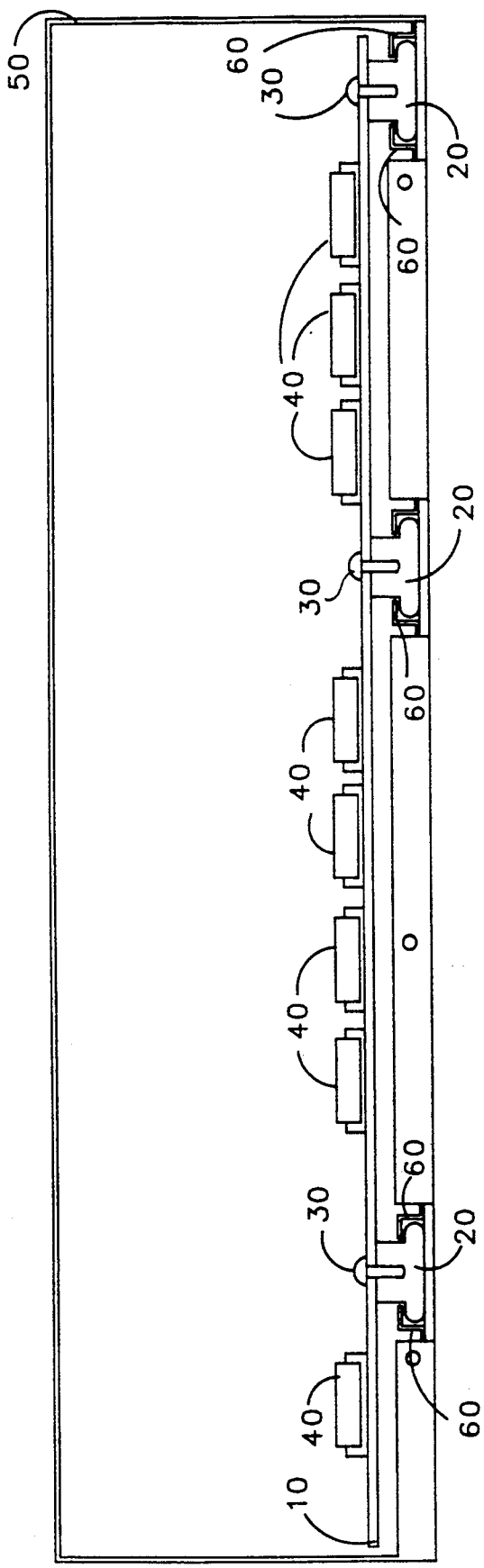
FIG. 1 is an illustration of a prior method of fastening a printed circuit board to a housing.

FIG. 1 shows one solution in the prior art which provides for attachment of a printed circuit board into a simple housing. The printed circuit board 10 is connected to rails 20 by screws 30. The printed circuit board may have a variety of electronic or electrical components 40 attached to it and interconnected to perform some electronic function. The assembly is attached to the housing 50 by grips 60. The grips 60 can be formed as part of the housing 10, and can even be of the same material.

Figure 2:
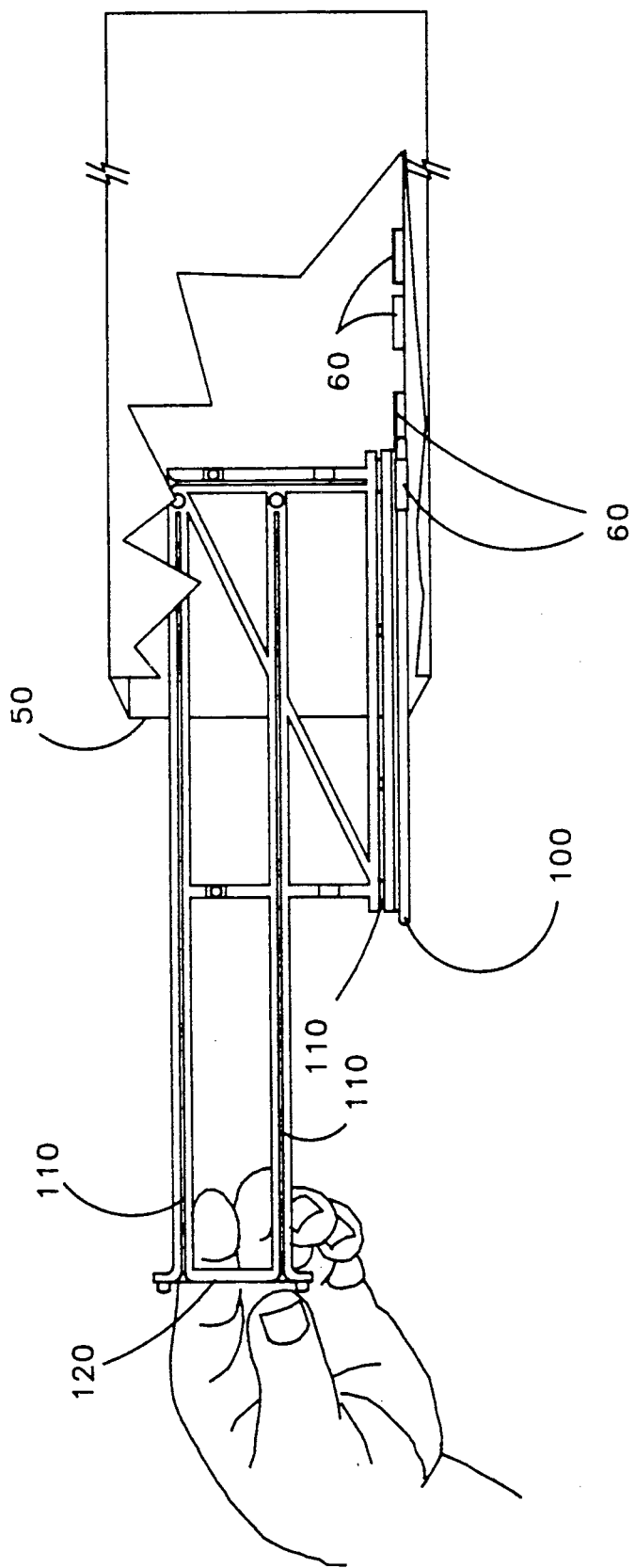
FIG. 2 shows the assembly of the present invention without a printed circuit board yet attached, and its relationship to the housing.

FIG. 2 shows the present invention be attached to the housing. In this embodiment, the rails 100 support multiple levels of printed circuit board by having multiple grooves 110. In this case, three levels of printed circuit board can be loaded into the attachment. The grooves are spaced so as to provide adequate clearance between the electronic components attached to the printed circuit boards. Wider separation is generally required for boards with components on both sides and for boards with larger size components like transformers or large capacitors. Also, the grooves do not all have to be equally spaced from each other. Depending on the particular components to be attached to any given board, that board may require less or more clearance than other boards to be assembled into the housing. The length of the grooves can vary since not all of the boards may have the same dimensions as depicted in the bottom groove 110. By properly designing and constructing different size boards, space can be left for other sub-assemblies or the sub-assembly connected to a cover, keypad, or keyboard mounted to the face of the housing 50.

The rails 100 slide into the grips 60. There are two sets of grips for each mounting 120. The printed circuit boards can be loaded in the attachment after the attachment is located into the housing 50 by simply sliding the boards into place along the grooves 110 of the attachment. No assembly with screws is required. This eliminates the needs for screws, reducing material costs, and eliminates the need for screwing the printed circuit boards onto the attachment, reducing labor and cycle time. The preferred embodiment has two mountings 120, one that slides in on each side of the housing 50. In this way, two opposite sides of a printed circuit board can be supported.

In this example, three printed circuit boards, two full-size and one half-size, are being supported by two mountings, each of the two rails are held by two sets of grips formed out of the housing material. Each mounting is monolithic plastic molded construction.

Figure 3:
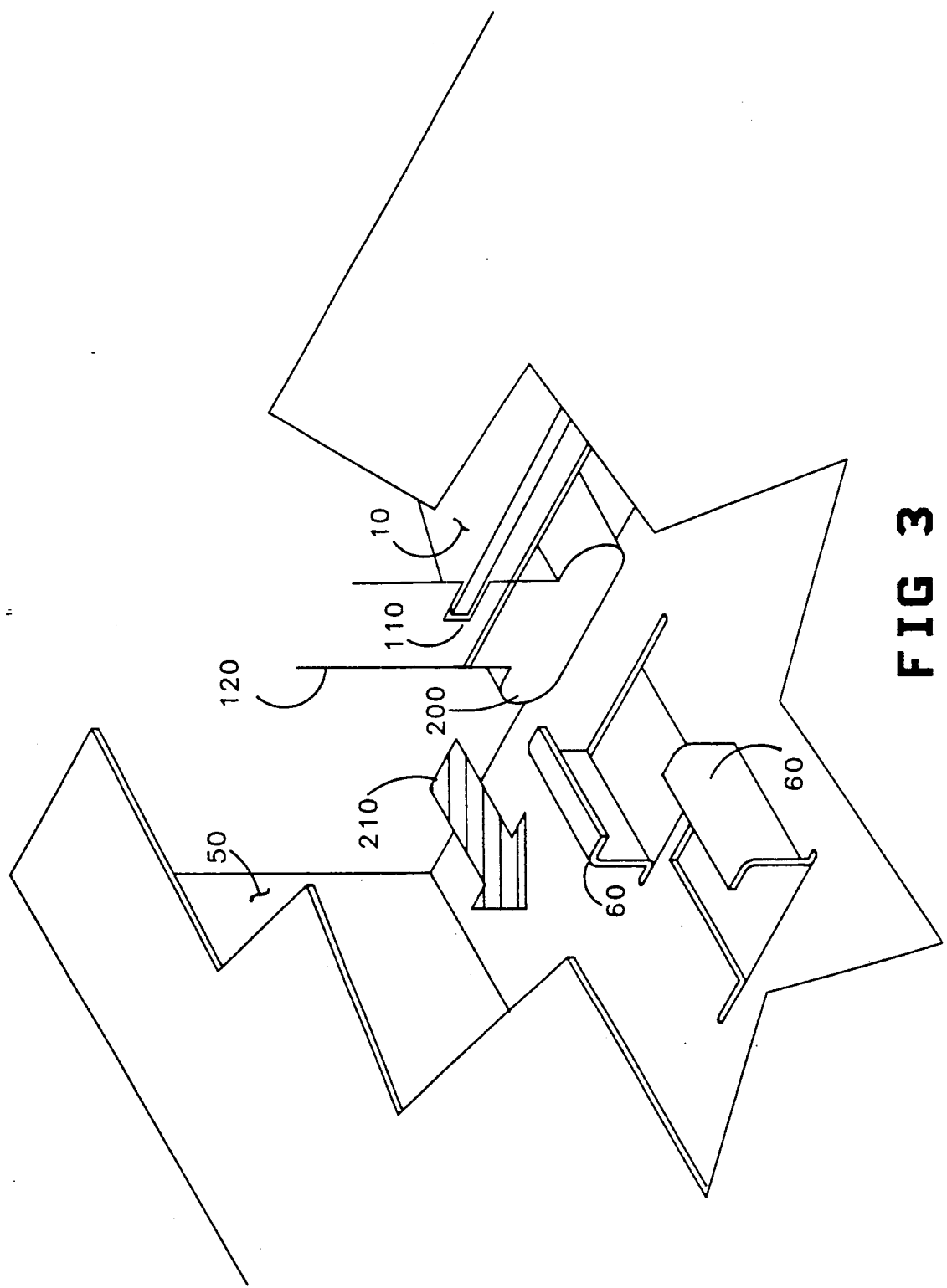
FIG. 3 is a close-up of the attachment of the present invention to the housing with the printed circuit board positioned in the groove of the present invention.

FIG. 3 shows a close-up of the attachment to the housing 50. In this case, the grips 60 are stamped and bent from the material forming the housing 50. The dimensions are preselected in order to allow the slide rail portion of the mount to slide through along the length 210 of the rail 200, bet yet secure it from movement in the other two orthogonal directions. The printed circuit board 10 is supported above the rail in the groove 110 on the mount 120.

Figure 4:
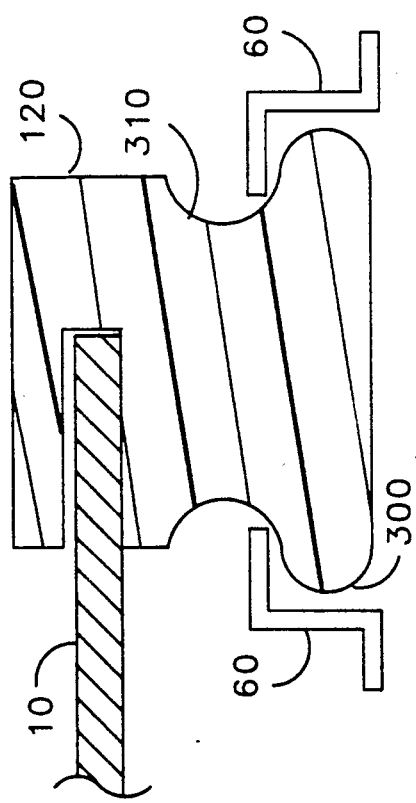
FIG. 4 illustrates another embodiment of the invention where only one circuit board is being attached to the housing by the present invention.

FIG. 4 shows a different embodiment of the rail portion 300. The grips 60 fit into a concave portion 310 of the rail 300. The mount 120 supports the printed circuit board 10 as in the other embodiments.

Figure 5:
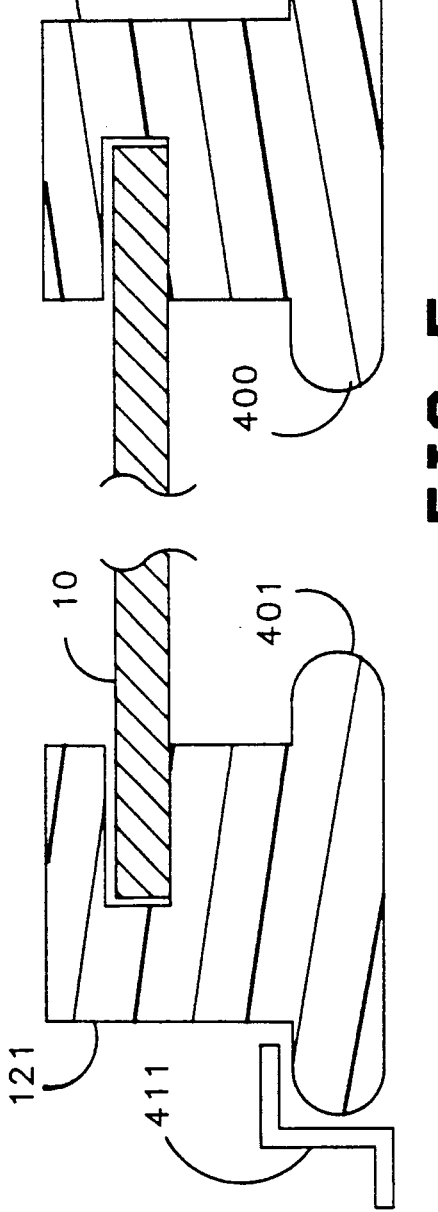
FIG. 5 illustrates another embodiment of the invention showing a variation of the gripping means.

FIG. 5 shows another variation of the grip design. Instead of two opposing grips at each point of attachment between each rail 400 nd 401 and the housing, the grips are arranged so that only one grip 410 is needed at each point adjacent rail 400 by using a grip 411 on a parallel rail 401 to counter the movement of both of the rails due to the printed circuit board 10 being supported by the mounts 120 and 121.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. Apparatus for slidable mounting of a printed circuit board into a housing of the type including a mounting surface, wherein said board includes opposite side edges, the apparatus comprising in combination:
   (a) first and second elongated slide members each having a support portion and a rail portion connected thereto, wherein each said support portion includes an elongated groove extending along the length of each slide member, wherein said groove in said first slide member faces said groove in said second slide member, wherein each said rail portion includes an engaging surface;
   a housing including a mounting surface, wherein said mounting surface includes spaced-apart gripping means for receiving the slide members, for guiding the slide members, for making contact to the engaging surface of each rail portion, and for securing each slide member to the housing in all direction except along the length of each rail portion;
   wherein said grooves are adapted to retain the opposite side of the printed circuit board in a manner such that the printed circuit board is parallel to said mounting surface and each said support portion comprises a plurality of grooves arranged and constructed to receive a plurality of printed circuit boards.

2. The apparatus of claim 1 wherein the gripping means comprises two opposing grips at each point of attachment of the rail portion to the housing.

3. The apparatus of claim 1 wherein the gripping means comprises one grip at each point of attachment of each rail portion to the housing, the gripping means preselected in orientation to provide for a grip at one of said slide members and a complementary grip at the other of said slide members.

4. The apparatus of claim 1 wherein the gripping means comprises two opposing grips at each point of attachment of the rail portion to the housing.

5. Apparatus in accordance with claim 1, wherein each said engaging surface comprises a recessed area in each said rail portion and extending along the length of each said rail portion.

6. Apparatus in accordance with claim 5, wherein each said recessed area is concave.

7. A method for securing a printed circuit board inside a housing of the type including a mounting surface comprising the steps of:
   providing spaced-apart gripping means on said mounting surface;
   providing first and second elongated slide members each having a support portion and a rail portion connected thereto, wherein each said support portion includes an elongated groove extending along the length of each slide member, wherein said groove in said first slide member faces said groove in said second slide member, wherein each said rail portion includes an engaging surface;
   sliding a printed circuit board into said grooves in said support portions of said slide members;
   sliding said slide members, with a printed circuit board attached, between said spaced-apart gripping means connected to the housing, said gripping means restricting all movement perpendicular to the direction of the sliding; wherein said printed circuit board is parallel to said mounting surface and each slide member comprises a plurality of grooves arranged and constructed to receive a plurality of printed circuit boards.

8. The method of claim 7 wherein the gripping means comprises two opposing grips at each point of attachment of each rail portion to the housing.

9. The method of claim 7 wherein the gripping means comprises one grip at each point of attachment of each rail portion to the housing, the gripping means preselected in orientation to provide for a grip at one of said slide members and a complementary grip at the other of said slide members.

10. The method of claim 7 wherein the gripping means comprises two opposing grips at each point of attachment of each rail portion to the housing.

11. The method of claim 7 wherein the gripping means is integral with the housing and made from the same material as said housing.

12. The method of claim 7 wherein the housing and the gripping means are metal.

13. Apparatus for attaching a printed circuit board having opposite side edges to a housing of the type having a mounting surface, the apparatus comprising in combinations:

first and second elongated slide members each having a support portion and a rail portion connected thereto, wherein each said support portion includes an elongated groove said groove in said first slide member faces said groove in said second slide member, wherein said grooves are adapted to slidably receive edges of a printed circuit board;

gripping means carried by said mounting surface of the housing, arranged and constructed to receive the slide members and secure the slide members from movement in substantially all directions except for a direction allowing the slide members to slide into the housing, wherein said grooves are adapted to retain a printed circuit board parallel to said mounting surface and wherein each said support portion of each said slide member includes a plurality of parallel grooves arranged and constructed to support a plurality of printed circuit boards.

14. The apparatus of claim 13 wherein the gripping means comprises a plurality of opposing bent 15. The apparatus of claim 13 wherein said gripping means comprises one bent finger at a point of attachment of one of said slide members and a second complementary bent finger at a corresponding point of attachment of the other of said slide members.

16. The apparatus of claim 13 wherein said gripping means comprises two spaced-apart opposing bent fingers arising out of said mounting surface of the housing to embrace each rail portion of each slide member.

* * * * *